United States Patent [19]

Webber et al.

[11] Patent Number: 5,149,244
[45] Date of Patent: Sep. 22, 1992

[54] APPARATUS FOR ALIGNING WAFERS WITHIN A SEMICONDUCTOR WAFER CASSETTE

[75] Inventors: Herbert Webber, Crawley Down; Peter Edwards, Horsham, both of United Kingdom

[73] Assignee: Applied Materials, Inc., Santa Clara, Calif.

[21] Appl. No.: 715,882

[22] Filed: Jun. 17, 1991

Related U.S. Application Data

[63] Continuation of Ser. No. 395,679, Aug. 18, 1989, abandoned.

[51] Int. Cl.⁵ .................................................. B65G 65/30
[52] U.S. Cl. ...................................... 414/417; 211/41; 414/DIG. 4; 206/334; 206/454
[58] Field of Search ................ 211/41; 269/37, 43, 269/296; 118/500; 206/334, 454; 414/403, 404, 405, 416, 417, DIG. 3, DIG. 4, DIG. 6

[56] References Cited

U.S. PATENT DOCUMENTS

| | | | |
|---|---|---|---|
| 3,949,891 | 4/1976 | Butler et al. | 414/405 |
| 3,961,877 | 6/1976 | Johnson | 206/454 X |
| 4,446,966 | 5/1984 | Moloney | 206/334 |
| 4,490,087 | 12/1984 | Ryan et al. | 414/417 |
| 4,520,925 | 6/1985 | Johnson | 206/334 |
| 4,522,697 | 6/1985 | Dimock et al. | 414/417 X |
| 4,566,839 | 1/1986 | Butler | 414/417 X |
| 4,566,841 | 1/1986 | Ohmura et al. | 414/417 |
| 4,653,636 | 3/1987 | Armstrong | 211/41 X |
| 4,687,097 | 8/1987 | Mortensen | 206/334 |
| 4,724,963 | 2/1988 | Mortenson | 211/41 X |
| 4,776,744 | 10/1988 | Stonestreet et al. | 414/417 X |
| 4,856,957 | 8/1989 | Lau et al. | 414/417 X |
| 4,987,407 | 1/1991 | Lee | 414/404 X |

FOREIGN PATENT DOCUMENTS

| | | | |
|---|---|---|---|
| 56-24921 | 3/1981 | Japan | 414/403 |
| 61-124407 | 6/1986 | Japan | 414/405 |

*Primary Examiner*—Robert J. Spar
*Assistant Examiner*—Robert S. Katz
*Attorney, Agent, or Firm*—Douglas L. Weller; Birgit E. Morris

[57] ABSTRACT

An improvement which allows precise positioning of wafers within cassettes in preparation for removal of the wafers by automated equipment. The improvement includes mounting two sawtooth jigs upon the surface upon which the cassette tray is to be placed which extend up into the cassette. Wafers within the cassette rest within the precisely aligned grooves of the sawtooth jigs.

8 Claims, 4 Drawing Sheets

APPARATUS FOR ALIGNING WAFERS WITHIN A SEMICONDUCTOR WAFER CASSETTE

This is a continuation of U.S. application Ser. No. 07/395,679 filed Aug. 18, 1989, now abandoned.

BACKGROUND OF THE INVENTION

1. Field of the Invention

This invention relates generally to semiconductor processing equipment and more particularly to semiconductor wafer cassettes used in conjunction with such equipment.

2. Description of the Related Art

In semiconductor processing equipment, such as ion implanters, wafers are often loaded and unloaded from cassettes having parallel, vertical slots each of which is receptive to a single, vertically oriented wafer. These cassettes may be mounted, for example, on cassettes trays coupled to the paddles of a load lock carousel. Wafers may be selectively lifted from the cassette by means of a vertical transport mechanism for transfer into the processing equipment.

In prior art processing equipment (see, for example, U.S. Pat. No. 4,776,744 of Paul Stonestreet et al., entitled "Systems and Methods for Wafer Handling in Semiconductor Process Equipment") the accurate manufacture of cassettes has been relied upon to assure that wafers were precisely situated within the cassette so as to allow accurate selection of wafers out of the cassette by automated equipment. However, in practice, cassettes manufactured from molded plastic have often failed to provide the necessary precise positioning of wafers required. Furthermore, as the cassettes are used they tend to wear, bend, and warp, making the precise positioning of the wafers all the more questionable. For example, various hot dip processes tend to severely warp cassettes.

Another problem with cassettes is that the wafers fit rather loosely within the slots. Since the base portions of the wafers are not immobilized the distance between the base portions of adjacent wafers can vary, compounding the difficulty of automated removal of the wafers.

SUMMARY OF THE INVENTION

An object of this invention is to provide a method and apparatus for precisely aligning wafers within a cassette regardless of the condition or positional accuracy of the cassette itself.

In accordance with the preferred embodiments of the present invention, an improvement is presented which allows precise positioning of wafers within cassettes in preparation for removal of the wafers by automated equipment. The improvement includes mounting two sawtooth jigs having V-shaped grooves on the cassette tray upon which the cassette is to be placed. The sawtooth jigs extend up into the base of the cassette to lift and support the wafers within the cassettes. Each wafer is supported at two points by opposing grooves of the sawtooth jigs. The sawtooth jigs thus precisely align the wafers within the cassette, facilitating the removal of the wafers by automated equipment.

An advantage of this invention is that the wafers are precisely supported within opposing V-shaped grooves of the sawtooth jigs. Since these jigs are not subject to deforming processes, such as hot dips, they tend to stay precisely aligned. Furthermore, since the grooves of the jigs are V-shaped, the base portion of the wafers are substantially immobilized ensuring precise alignment with the vertical transport mechanism of the semiconductor processing equipment.

These and other object and advantages of the present invention will no doubt become apparent upon a reading of the following descriptions and a study of the various figures of the drawing.

DETAILED DESCRIPTION OF THE PREFERRED EMBODIMENTS

Figure 1:
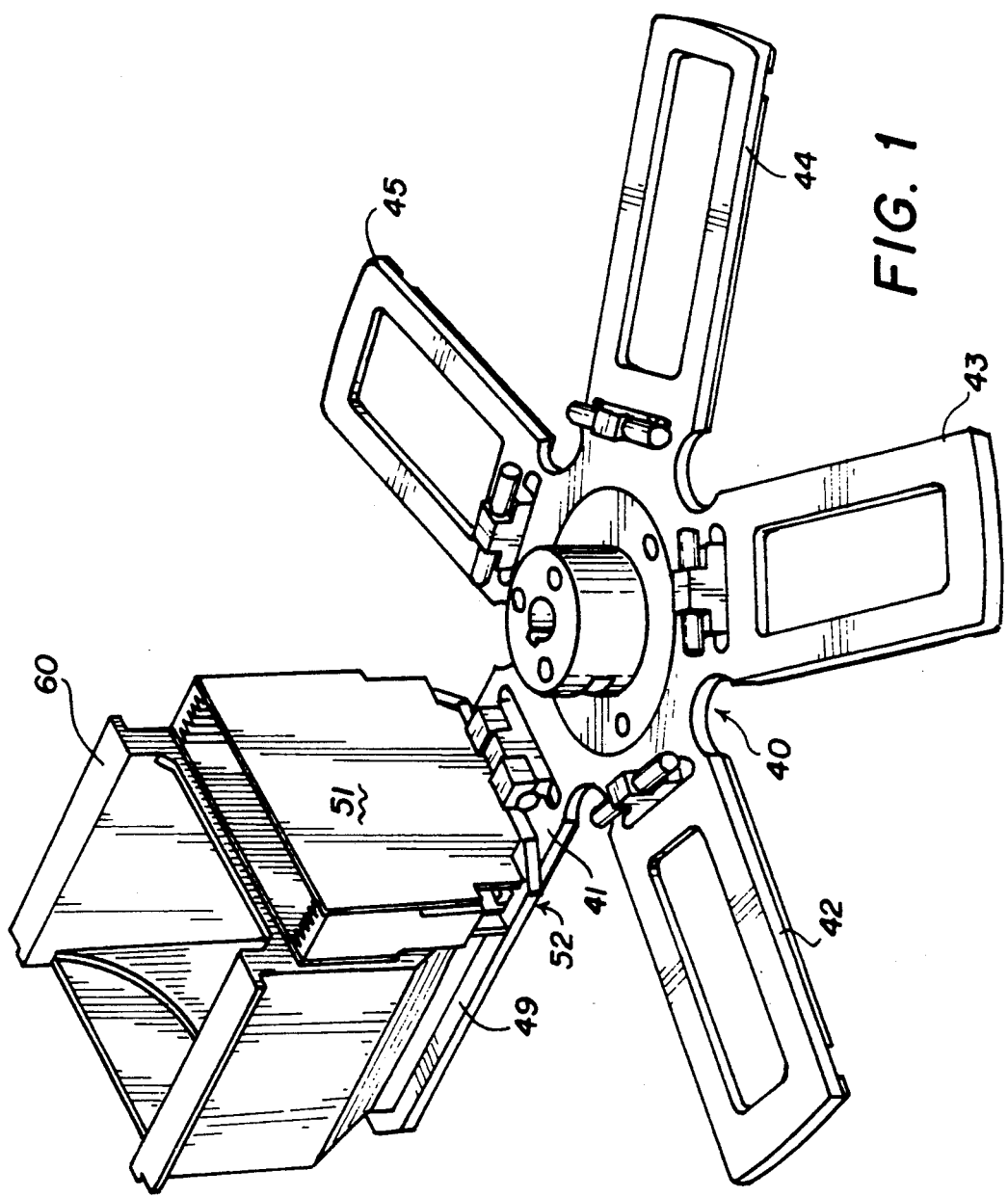
FIG. 1 shows a wafer cassette supported on a cassette tray which, in turn, is supported on a paddle of a load lock carousel.

In FIG. 1, a load lock carousel 40 is shown. Carousel 40 includes a paddle 41, a paddle 42, a paddle 43, a paddle 44, and a paddle 45. A cassette tray can be mounted on each of paddles 41–45 of load lock carousel 40. For example, shown mounted on paddle 41 is a cassette tray 52. The cassette tray 52 includes a horizontal base portion 49 which attaches to paddle 41, and a vertically disposed dummy wafer portion 51 which can hold up to five dummy wafers. A cassette 60 is shown to be engaged with base 49 of cassette tray 52 and to be in close proximity with the dummy wafer portion 51. A more complete description of how load lock carousel 40 may be used with systems and methods for wafer handling in semiconductor process equipment is given in the previously cited U.S. Pat. No. 4,776,744.

Figure 2:
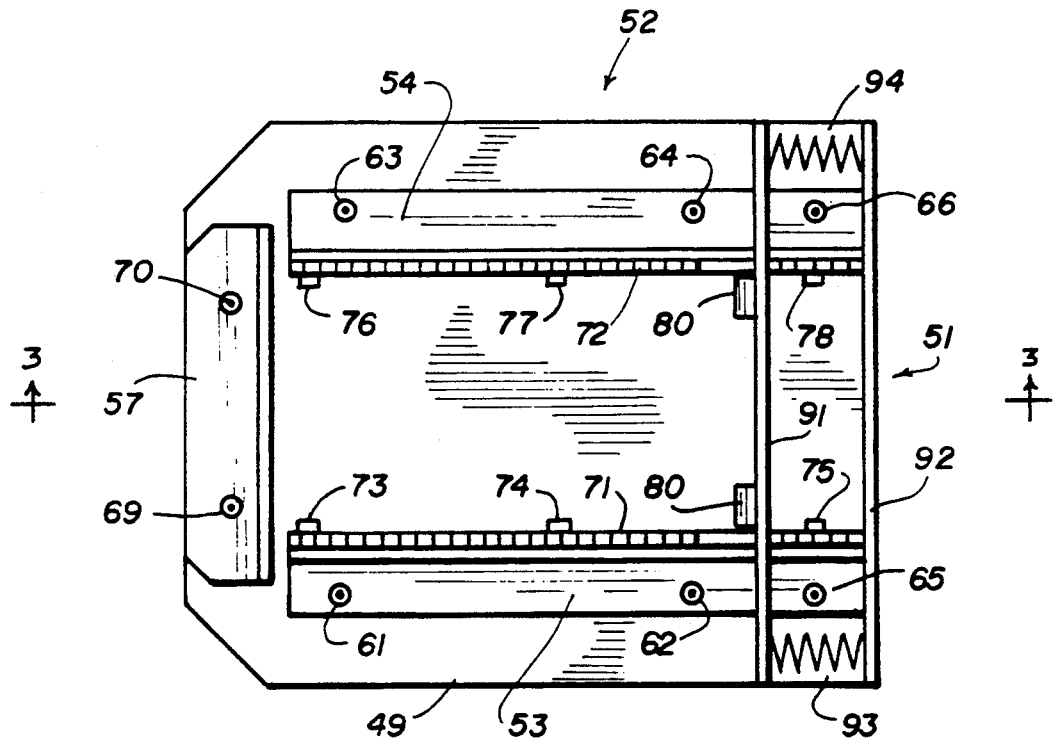
FIG. 2 shows a top view of a cassette tray in accordance with the present invention.

FIG. 2 is a top view of cassette tray 52 with cassette 60 removed. A bracket 57 serves as a guide to assure proper placement of the cassette 60 on cassette tray 52. Bracket 57 is affixed to cassette tray 52 with screws 69 and 70. A sawtooth jig 71 and a sawtooth jig 72 are used to correctly situate wafers within a cassette placed upon cassette tray 52. Sawtooth jig 71 is mounted upon an L-shaped bracket 53, for example, with the use of rivets 73, 74, and 75. Bracket 53 is mounted on base portion 49, for example, with the use of screws 61, 62, and 65. Sawtooth jig 72 is mounted upon an L-shaped bracket 54, for example, with the use of rivets 76, 77, and 78. Bracket 54 is mounted on base portion 49 for example, with the use of screws 63, 64, and 66. Dummy wafer portion 51 includes a pair of opposing end walls 91 and 92 and a pair of opposing wafer retention members 93 and 94. Dummy wafers may be placed within opposing grooves of the wafer retention members 93 and 94 and in engagement with opposing grooves between teeth of sawtooth jigs 71 and 72.

Figure 3:
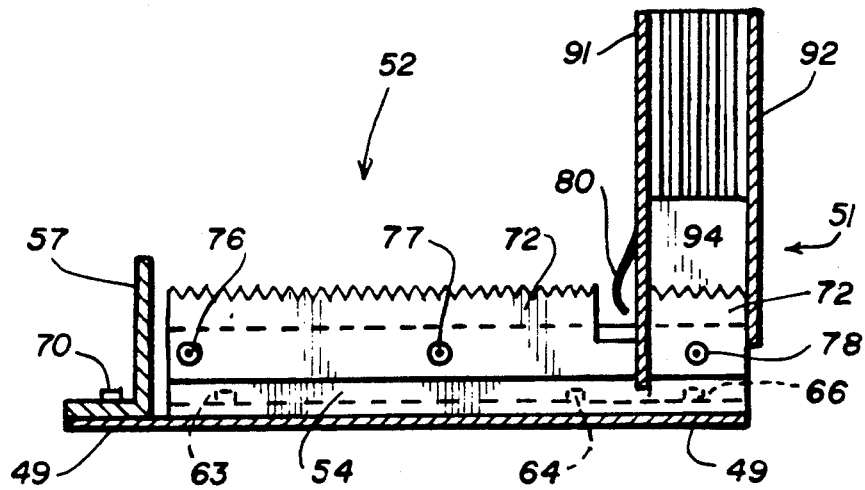
FIG. 3 shows a cross-sectional view of the cassette taken along line 3—3 of FIG. 2.

FIG. 3 is a cross-sectional view of cassette tray 52 with cassette 60 removed. A pair of leaf springs 80 (one seen here) are attached to end wall 91 of dummy wafer portion 51. Springs 80 help hold a cassette 60 firmly in place when it is engaged with brackets 53, 54, and 57 of cassette tray 52.

Figure 4:
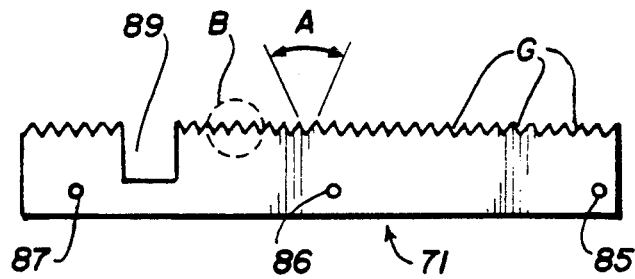
FIG. 4 shows a side view of the sawtooth jig of FIGS. 2 and 3.

FIG. 4 shows sawtooth jig 71 of FIGS. 2 and 3 in greater detail. Sawtooth jig 72 is essentially identical to sawtooth jig 71. Sawtooth jig 71 includes a hole 85, a hole 86, and a hole 87 for screws 73, 74, and 75, respectively. For 150 millimeter wafers sawtooth jig 71 typically includes 30 grooves with a pitch of 4.76 millimeters to match standard 150 millimeter cassette size and slot spacing. A 200 millimeter version (not shown) includes 25 grooves with a pitch of 6.35 millimeters to match standard 200 millimeter cassette size and slot spacing. The 200 millimeter version of the cassette tray of the present invention omits the dummy wafer portion 51 in favor of a dedicated dummy wafer cassette attached to one of the remaining paddles 42–45 of the load lock carousel 40.

Figure 6:
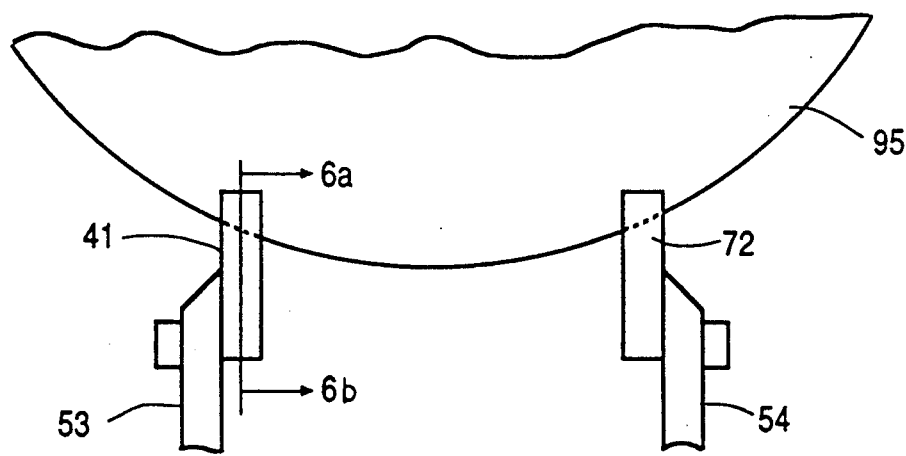
FIG. 6 shows a partial view of a wafer supported in another embodiment of the jig of the invention.
Figure 6A:
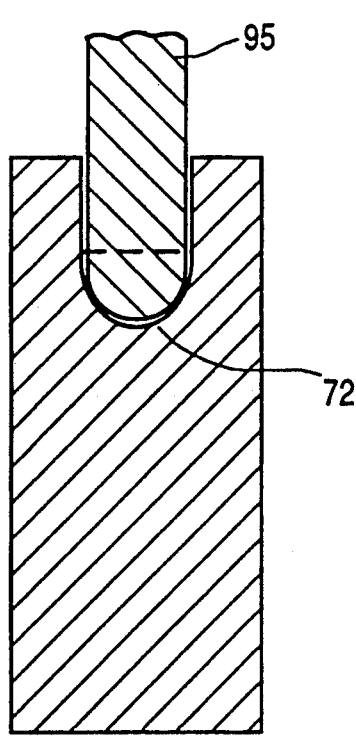
FIG. 6A is a side view taken along the lines 6A—6B of FIG. 6 of a wafer supported by the jig of FIG. 6.
Figure 6B:
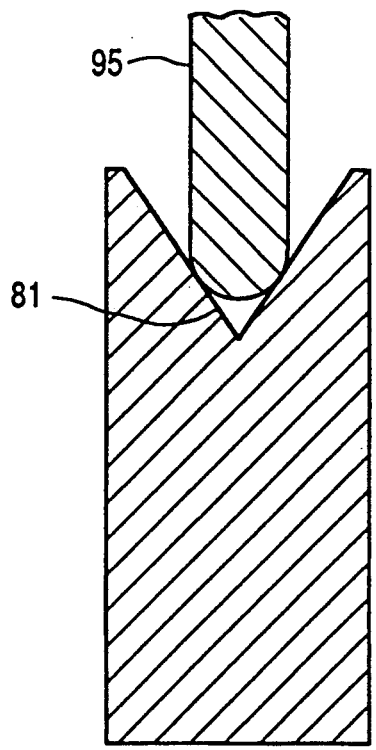
FIG. 6B is a side view taken along the lines 6A—6B of a wafer supported by a V-shaped groove of a jig of the invention.

Each groove G is manufactured at an angle A, typically between 59 and 61 degrees. The bottom of each groove may be a curved surface 72 having a radius of curvature which closely matches the radius of curvature of the wafer 95 it supports as shown in FIGS. 6 and 6A. However, as shown in 6B in practice the bottom of each groove 81 will most likely be straight and angled relative the base portion 49 such that it is tangentially disposed relative to a wafer's curvature.

A first group of twenty-five grooves seen to the right of FIG. 4 are used to provide correct placement of wafers within a cassette. A second group of five grooves seen to the left of FIG. 4 are used to provide correct placement of dummy wafers within the dummy wafer portion. The two groups of grooves are separated by a well 89 which measures 15 millimeters across and 10 millimeters deep which accommodates leaf-spring 80. Alternatively, the sawtooth jig 71 can be made in two sections, i.e. a twenty-five groove section for the wafers in a cassette and a five groove section for the dummy wafers, which are then separately attached to bracket 53 with the aforementioned separation of 15 millimeters.

Figure 4B:
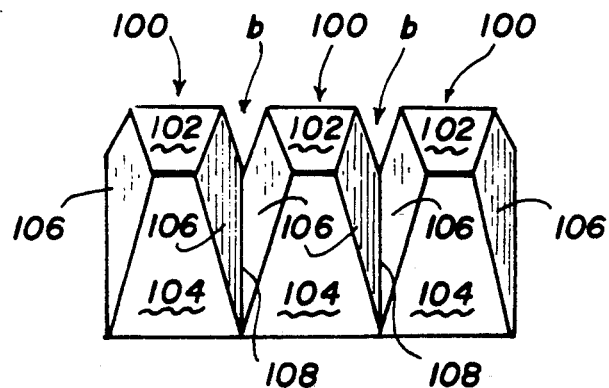
FIG. 4B is a detail view of the three teeth encircled by broken line B of FIG. 4.

FIG. 4B is a detail view of three teeth of the sawtooth jig 71 that are encircled by broken line B in FIG. 4. Each tooth 100 is separated by a substantially V-shaped gap G. Each tooth 100 includes a substantially horizontal, trapezoidal top surface 102 and a substantially vertical, trapezoidal front surface 104. The teeth 100 also have skewed, trapezoidal side surfaces 106 which intersect at the aforementioned angle A. The bottoms 108 of the grooves G are, as mentioned previously, short, linear sections which tangentially approximate the curvature of the wafers that they support.

Figure 5:
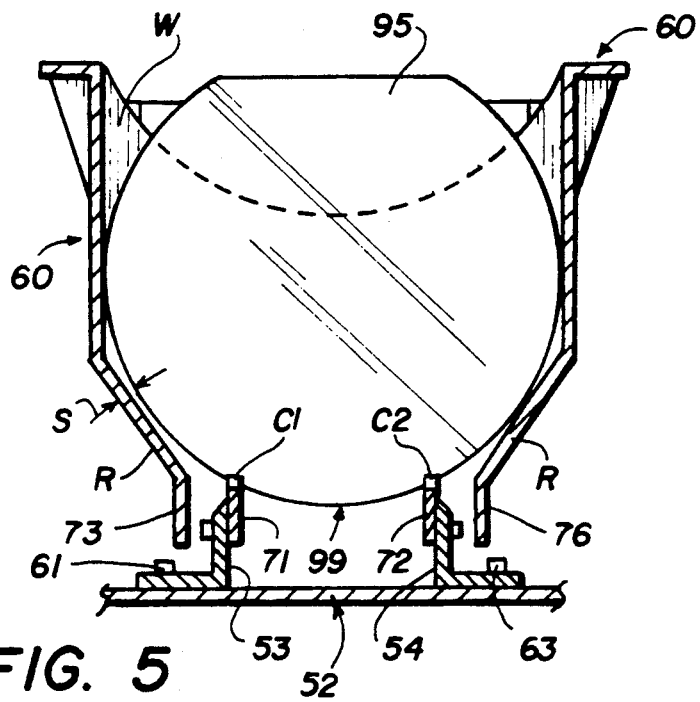
FIG. 5 shows a front view of the cassette in FIG. 1 mounted on the cassette tray shown in FIG. 2.

FIG. 5 shows a cut-away front view of cassette tray 52 with cassette 60 in place. Wafers within cassette 60 rest within grooves G of sawtooth jigs 71 and 72. For example, a wafer 95 within cassette 60 is shown resting in a groove within sawtooth jig 71 and in a groove within sawtooth jig 72. It should be noted that when the wafer 95 is being supported by the sawtooth jigs 71 and 72 that it is no longer being supported against gravity by support rails R of cassette 60, although it is supported laterally by divider walls W of the cassette 60. This results in a small space S between the support rails R and the wafer 95 thereby ensuring that the alignment of a bottom portion 99 of the wafer 95 is determined solely by its two points of contact C1 and C2 with sawtooth jigs 71 and 72, respectively. Since the grooves G of the sawtooth jigs 71 and 72 are substantially V-shaped, the bottom portion 99 of wafer 95 is substantially immobilized with respect to longitudinal motion in the direction of the sawtooth jigs 71 and 72.

As shown, sawtooth jig 71 and sawtooth jig 72 may be permanently mounted upon cassette tray 52. Wafers within each cassette thereafter placed upon cassette tray 52 will be properly positioned within the cassette tray and ready for selective lifting by means of a vertical transport mechanism. In this way, precise alignment of wafers within cassettes is achieved by a means not dependent upon precision manufacturing of molded plastics cassettes.

While the present invention has been described in terms of several preferred embodiments various alterations, modifications, and extensions thereof will no doubt become apparent to those skilled in the art upon a study of the specification and drawings. For example, various alternative configurations for the jigs can be used, such as slotted jigs or wavy surfaced jigs. Also, a single sawtooth jig can also be used to position the bottom portion of a wafer under some circumstances. It is therefore intended that the following appended claims be interpreted as including such alterations, modifications, and extensions which actually fall within the true spirit and scope of the present invention.

What is claimed is:

1. In semiconductor process equipment in which wafers are removed individually from a cassette by automated equipment, an improvement comprising:
    jig means extendable into a bottom portion of said cassette and engageable with a bottom edge portion of said wafers to lift said wafers from contact with said bottom portion of said cassette, where said jig means provides precise positioning of said bottom edge portion of said wafers within said cassette to facilitate removal of said wafers individually from said cassette by means of said automated equipment, said jig means including a first elongated body having an upper surface provided with a plurality of teeth separated by substantially V-shaped grooves, where the bottom portion of each groove is configured to accept an edge of a semiconductor wafer, and where a top of each of the plurality of teeth form a trapezoid with two parallel sides of unequal length.

2. An improvement as recited in claim 1 wherein said jig means additionally includes a second elongated body of substantially the same configuration as said first elongated body and means for coupling together said first and second elongated bodies such that said substantially V-shaped grooves are in substantial alignment.

3. An improvement as recited in claim 2 wherein bottom portions of said grooves are angled such that they are substantially tangential to the edges of said wafers.

4. An improvement as recited in claim 2 wherein bottom portions of said grooves are curved with substantially the same radius of curvature as the edges of said wafers.

5. In semiconductor processing equipment, a combination comprising:
    a surface,
    a cassette tray containing wafers for processing by the semiconductor processing equipment, said wafers to be removed individually from the cassette tray by automated equipment, said cassette having an open bottom; and, a jig coupled to said surface such that when said cassette is placed on said surface said jig extends upwardly through said open bottom of said cassette and wafers within the cassette rest upon said jig which provides precise positioning of the wafers within the cassette thereby facilitating removal of the wafers from the cassette by said automated equipment, said jig having an elongated body including an upper surface provided with a plurality of teeth separated by substantially V-shaped grooves, where the bottom portion of each groove is configured to accept an edge of a semiconductor wafer, and where a top of each of the plurality of teeth form a trapezoid with two parallel sides of unequal length.

6. A combination as recited in claim 5 wherein said jig is a first jig and further comprising a second jig coupled to said surface, wherein said second jig has an elongated body of substantially the same configuration as the first elongated body of the first jig, and means for coupling together said first and second jigs such that said substantially V-shaped grooves are in substantial alignment.

7. An improvement as recited in claim 6 wherein bottom portions of said grooves are angled such that they are substantially tangential to the edges of said wafers.

8. An improvement as recited in claim 6 wherein bottom portions of said grooves are curved with substantially the same radius of curvature as the edges of said wafers.

* * * * *